United States Patent [19]

Suzuki

[11] Patent Number: 5,485,469
[45] Date of Patent: Jan. 16, 1996

[54] SIGNAL RECORDING AND/OR REPRODUCING DEVICE FOR UNEQUAL QUANTIZED DATA WITH ENCODED BIT COUNT PER FRAME CONTROL OF WRITING AND/OR READING SPEED

[75] Inventor: Hiroshi Suzuki, Saitama, Japan

[73] Assignee: Sony Corporation, Japan

[21] Appl. No.: 391,278

[22] Filed: Feb. 21, 1995

Related U.S. Application Data

[63] Continuation of Ser. No. 931,790, Aug. 18, 1992, abandoned.

[30] Foreign Application Priority Data

Aug. 29, 1991 [JP] Japan ................................. 3-244643

[51] Int. Cl.[6] ........................ G11B 19/28; G11B 20/18; H03M 13/00
[52] U.S. Cl. ................................. 371/41; 360/8; 360/74.5
[58] Field of Search ............................. 371/41, 15.1, 18, 371/20.4, 21.1, 22.1; 360/8, 70, 51, 73.05, 77.13, 73.1, 74.5; 341/67

[56] References Cited

U.S. PATENT DOCUMENTS 3,851,116 11/1974 Canno ................................. 340/174.1
4,413,289 11/1983 Weaver et al. ............................. 360/51
4,503,420 3/1985 Rub et al. ........................ 340/347 DD
4,995,041 2/1991 Hetherington et al. ................ 371/40.1
5,045,954 9/1991 Oishi et al. ................................. 360/8
5,057,917 10/1991 Shaltauser et al. ..................... 358/135
5,162,795 11/1992 Shirota ..................................... 341/67

*Primary Examiner*—Hoa T. Nguyen
*Attorney, Agent, or Firm*—Ronald P. Kananen

[57] ABSTRACT

Using an IC memory card as a recording medium, quantized data is encoded in an unequal length manner by unequal length encoders, an error correction code is added in an error correction code addition section, and the data is recorded along with the control data of the fixed speed. At this time, a writing speed/time control circuit controls the writing speed or writing time corresponding to the number of the encoded bits per frame. An error correction method selection section modulates the length of the error correction codes corresponding to the number of the bits per frame. A buffer and countermeasures for overflow and underflow become unnecessary, error correction codes can be efficiently added, and the access to the respective frame units becomes easily possible.

13 Claims, 8 Drawing Sheets

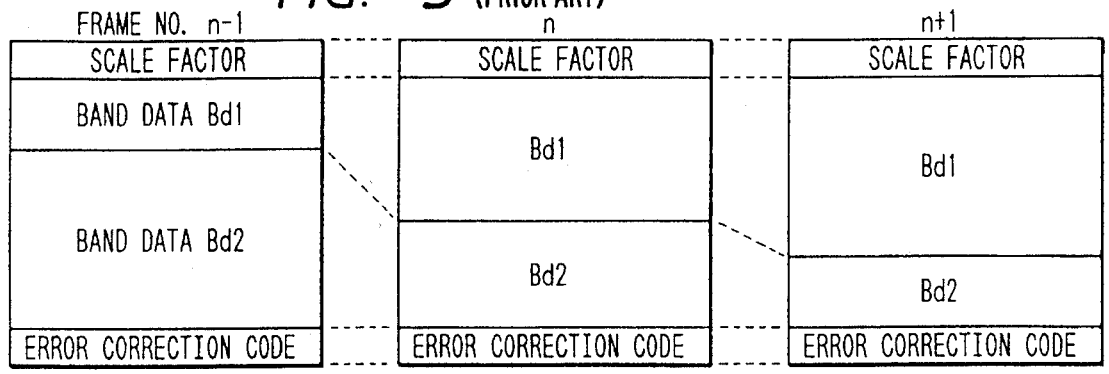
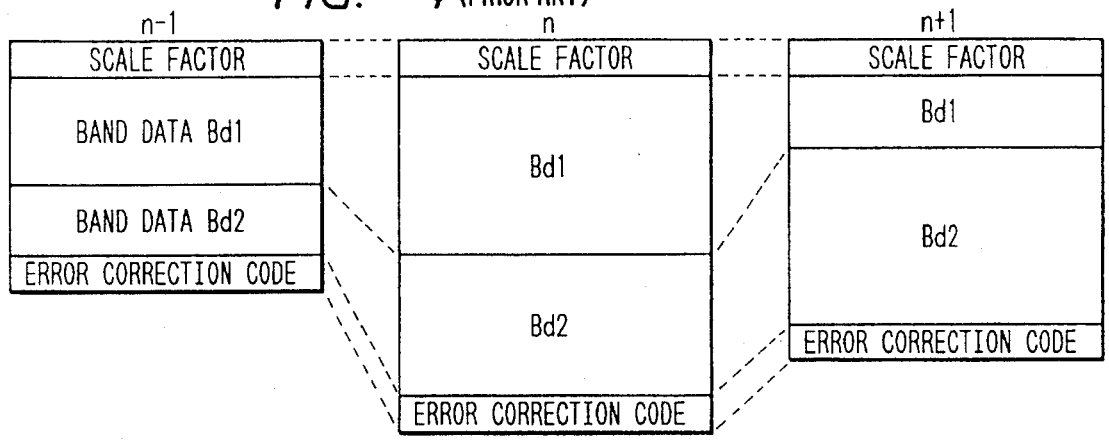
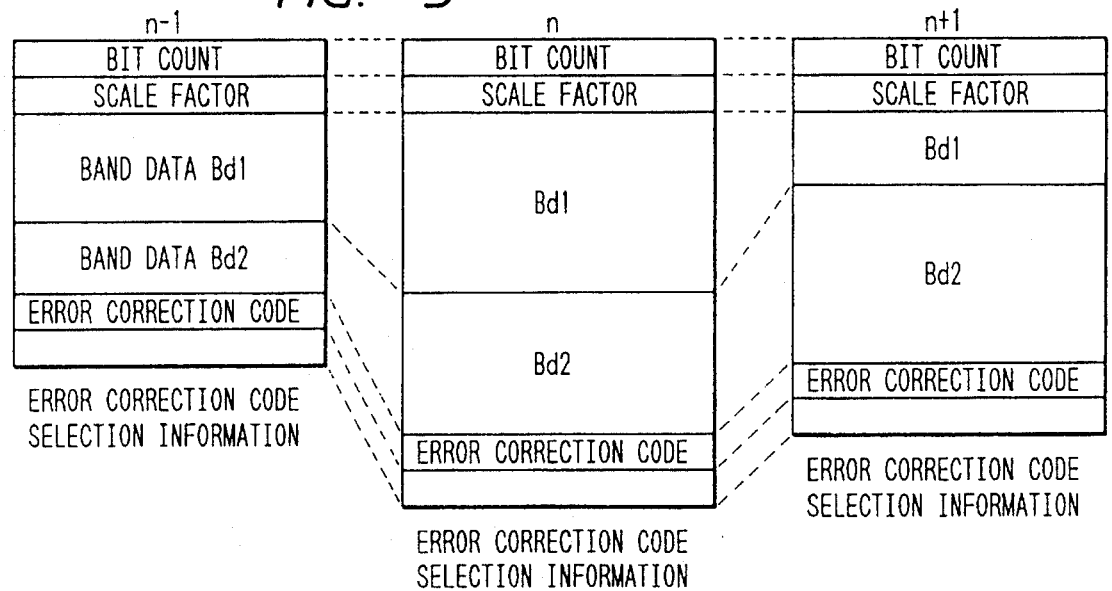

SIGNAL RECORDING AND/OR REPRODUCING DEVICE FOR UNEQUAL QUANTIZED DATA WITH ENCODED BIT COUNT PER FRAME CONTROL OF WRITING AND/OR READING SPEED

This application is a continuation of application Ser. No. 07/931,790, filed Aug. 18, 1992, now abandoned.

BACKGROUND OF THE INVENTION

1. Field of the Invention

The present invention relates to a signal recording and/or reproduction device that records and/or reproduces encoded data unequal length for a recording medium such as a semiconductor memory and so forth.

2. Brief Description of Relevant Art

FIG. 8 shows one example of an encoding device of the prior art which does not employ an unequal length encoding system.

In FIG. 8, an analog tone signal is A/D converted with an A/D (analog/digital) converter 101 into a digital signal and arranged for every fixed sample number of data and outputted, for frame processing. This data is frequency-analyzed with a frequency analyzer 102 and separated into signals of, for example, two bands frequency bands.

Each frequency analyzed band signal is fed to a scale factor computer 103 or 109 which determines each scale factor for quantization, and is fed to a scale factor quantizer 104 or 110. At the scale factor quantizer 104 or 110, each of the above mentioned scale factors is quantized with a fixed number of the bits and sent to either a scale factor dequantizer 105 or 111, or a multiplexer 107. At the scale factor dequantizer 105 or 111, each of the quantized scale factors are dequantized. These dequantized values are each fed to quantizers 106 or 108 while also being fed to a quantized bit count determiner 112, and the bit count for the quantization of each band signal is determined. These bit counts are fed to the quantizers 106 or 108, and depending on each of the dequantized scale factors and bit counts, the data of the two band signals from the above mentioned frequency analyzer 102 is quantized and outputted to the multiplexer 107. At the multiplexer 107, the quantized data and quantized scale factor of each band is multiplexed and fed to the error correction code adder 120. At the error correction code adder 120, the error correction codes are added, and the bit stream data is outputted to a transfer line of a determined bit rate or to a recording and reproducing system such as a digital audio tape DAT recorder.

Next, FIG. 9 shows an example of a decoding device of the prior art which does not employ an unequal length encoding system.

In the decoding device shown in FIG. 9, bit stream data which is output from the above-described encoding device and drawn through the transfer line or reproduced from a DAT or the like is inputted to an error correction restorer 220, and error correction processing is done according to error correction codes for each fixed amount of data. This error correction processed bit stream data is divided into quantized data and quantized scale factors of each of the above mentioned bands by a demultiplexer 201. The quantized scale factors for each of the above mentioned bands are each dequantized with scale factor dequantizers 204 and 207, and are sent to either of dequantizers 202 and 206 and quantized bit count determiner 208. At the quantized bit count determiner 208, the quantized bit counts for each of the above-mentioned bands are determined and outputted to their respective dequantizers 202 and 206. At the dequantizers 202 and 206, the quantized data for each of the above-mentioned bands is dequantized according to the dequantized scale factors and quantized bit counts for each band. The dequantized data of each band is then synthesized by a frequency synthesizer 203, and D/A (digital/analog) converted with the D/A converter 205 and outputted.

Next, a case where an unequal length manner is applied to the above-mentioned encoding and decoding system will be discussed. This unequal length encoding, also called variable length encoding, is an encoding process which makes allocation by changing the length of a code which is allocated according to the probability of occurrence of the data. That is, a shorter code is allocated for a higher probability of occurrence, and a longer code is allocated for a lower probability of occurrence, presenting a method for encoding which makes an average code length short and efficiently. The Huffman code is representative of such a method.

Generally, data is converted into a statistical model, such as a Gaussian distribution or Laplacian distribution model. Therefore, for data of such distribution, shorter codes are allocated for data of lower, amplitude, since the probability of occurrence is higher at lower amplitude, and longer codes are allocated for data of higher amplitude, since the probability of occurrence is lower at higher amplitude.

FIG. 10 shows an encoder of an encoding device which applies an unequal length encoding system according to the prior art, and FIG. 11 shows a decoding device also according to the prior art.

Concerning the encoding device shown in FIG. 10, the configuration of the A/D converter 301, the frequency analyzer 302, scale factor computers 307 and 312, scale factor quantizers 308 and 313, scale factor dequantizers 309 and 314 and quantizers 303 and 310, which are responsible for processing of A/D conversion, frequency analysis, determining of scale factor and quantized bit counts for each band, as well as the configuration and action of each band data until its quantization, is the same as that of the encoding device in the above FIG. 8, and an explanation thereof will therefore be omitted. The data of each band which was quantized by quantizers 303 and 310 are inputted to unequal length encoders 304 and 311 and are encoded in an unequal manner. This data is then inputted to a multiplexer 305. Thus the bit stream data outputted from the multiplexer 305 becomes the bit count of unequal lengths for each frame. This bit stream data is stored in a buffer 306, converted into fixed bit rate data and fed to an error correction code adder 320. At the error correction code adder 320, an error correction code is added to each group of fixed data, and it is outputted to a fixed bit rate transfer line or a recording and reproduction system such as a DAT or the like.

Next, concerning the decoding device shown in FIG. 11, the bit stream data which was obtained from the transfer line or DAT or the like is inputted to an error correction restorer 420, and error correction processing is done according to codes for error correction for each amount of fixed data. Since this error corrected bit stream data becomes the unequal length bit count for each frame, it is stored in a buffer 401. This bit stream data is divided into main data and scale factors by a multiplexer 402. The data of each band is then inputted to unequal length code decoders 403 and 408 for decoding, and fed to dequantizers 404 and 409. Processing at scale factor dequantizers 407 and 410, a quantized bit count determiner 411, a frequency synthesizer 405 and a D/A converter 406 are the same as that of the decoding device in FIG. 9, and an explanation thereof will therefore be omitted.

Incidentally, in a recording and reproducing device of the prior art which employs unequal length encoding as shown in the above-described FIGS. 10 and 11, the bit rate for transfer or recording is fixed, and hence a buffer is established in order to record/reproduce in real time. That is, the state of the buffer at any given time is:

$$B(n)=B(n-1)+Bin(n)-Bout(n) \ [bits] \quad (1)$$

In this equation (1), n represents the $n^{th}$ memory update cycle of the buffer, B (n) represents the amount of data stored in the buffer, Bin (n) represents the amount of data inputted to the buffer and Bout (n) represents the amount of data outputted from the buffer. Bin (n) of this equation is of an unequal length, while Bout (n) is fixed. In such a situation, problems occur. That is, when, for example, a long code is allocated in a concentrated fashion, a so-called overflow condition results in which the amount of data B (n) input into the buffer exceeds the capacity of the buffer Bmax (B (n)>Bmax), whereas when a shorter code is allocated in a concentrated fashion, a so-called underflow condition results in which feeding from the buffer or recording ceases (B (n)<0).

The solution according to the prior art involves such measures as:

(a) allocation of a large memory capacity in the buffer; and (b) value change of the scale factors for quantization in a direction which inhibits overflow or underflow, in cases where such an occurrence is foreseen.

In the above measure (b), the state of the buffer is observed, and when an overflow seems likely to occur, the scale factor is increased and the signal to be quantized is decreased. Since a shorter code is allocated for a signal of lower amplitude, it is possible to prevent an overflow. When an underflow seems likely to occur, the scale factor is decreased and the signal to be quantized is increased. Since a longer code is allocated for a signal of higher amplitude, it is possible to prevent an underflow.

Both measures have their disadvantages, as in the first (a), in order to have a large buffer capacity, it is necessary to increase the magnitude of the hardware, and in the second (b), in order to manipulate the scale factor, desired characteristics become unattainable.

Incidentally, in recent years and in the future, the use of semiconductor memory has been and is being considered as a recording medium. Concretely, devices are being conceived which record/reproduce an audio signal, and so forth, using a so-called IC memory card. This type of signal recording or reproduction device which uses an IC memory card, and so forth, has many advantages in that it requires no movable parts, allows high-speed access and is easily miniaturized, and represents a very promising recording medium if memory capacity increase and cost reduction can be achieved. When using a semiconductor memory of an IC memory card, and so forth, as a recording medium, it would be desirable to employ a powerful unequal length encoding system from the point of view of increasing compression efficiency.

In a recording and/or reproduction device capable of recording and reproducing in real time utilizing a semiconductor memory as its recording and reproduction package medium, when unequal length encoding is employed as an encoding method, we propose utilization of the fact that, due to the lack of movable parts, there is no need to write/read at a fixed speed, and control of the time or speed of writing/reading according to the bit count per frame, which will render a buffer, as well as measures against the above mentioned overflow and underflow, unnecessary.

In cases which employ such technology, however, due to the fact that the bit rate of writing/reading for each frame is not fixed, it becomes necessary when implementing a random access to read the control signals of all the frames, and a time-loss thus occurs in situations where searching is made to each frame unit over the entire range of the recording signal. Also, since the speed of writing/reading is not fixed, adding error correction codes for fixed amounts of data as in the prior art, as well as error correction restoration, becomes troublesome.

The present invention was developed in the light of these circumstances of the prior art, in order to provide a signal recording device and/or reproduction device, using a semiconductor memory as a recording medium, which does not require buffer processing when employing an unequal length encoding system, which requires no measures against overflow and underflow of the buffer, and allows instantaneous access to each frame unit and efficient adding of error correction codes.

SUMMARY OF THE INVENTION

A signal recording and/or reproduction device according to the present invention, involving a signal recording and/or reproduction device which records and/or reproduces a signal through a recording medium, provides a solution to the above described problems by controlling the writing speed and writing time according to the code bit count per frame when the quantized data is encoded and recorded as unequal length codes, controlling the reading speed and reading time according to the bit count per frame of the data read when reading data, and recording and reproducing the sections of fixed and non-fixed (or unequal or variable) speed and time for recording or reproduction, for each of the differing areas of the above mentioned recording medium.

Also, a signal recording and/or reproduction device according to the present invention provides a solution to the above described problems by controlling the writing speed and writing time according to the coded bit count per frame when the quantized data is encoded and recorded as unequal length codes, controlling the reading speed and reading time according to the bit count per frame of the data read when reading data, and recording and reproducing also the error correction codes as unequal length codes according to the bit count per frame of the above data, for the above mentioned recording medium.

One example of a signal recording and/or reproduction device to which the present invention applies would be a signal recording and/or reproduction device capable of recording and reproducing in real time using a semiconductor memory such as an IC memory card or the like as a recording and reproducing package medium. The write signal could be controlled in such a way that writing is done at a higher speed in the case of a larger bit count and at a lower speed in the case of a smaller bit count, where the writing speed is according to the encoded bit count per frame when recording involving the above-mentioned unequal length encoding. Or, writing could always be done at a high speed, and the signal is recorded controlling the write signal in such a way that the writing time is controlled. Further, when reading is done, the read signal could be controlled in such a way that reading is done at a higher speed in the case of a larger bit count and at a lower speed in the case of a smaller bit count, where the reading speed is according to the bit count per frame of data read. Or reading could always be done at a high speed, and the signal is reproduced controlling the read signal in such a way that the reading time is controlled.

The data of the fixed recording and reproducing speed or time mentioned above could be information relating to the main data of each frame, for example control data including frame ID, start address, bit count, and so forth. That is, when this control data is recorded at a fixed speed and then read, this control data is read at a fixed speed from a specific section of the recording medium, and the reading speed and reading time is controlled according to the bit count per frame of the data read, based on the control data. This control data is recorded in a separate location than that of the main data, such as musical data, within the semiconductor memory such as, for example, an IC memory card, making possible instantaneous access to each frame unit.

In operation, since the writing/reading speed or time is being controlled according to the bit count per frame, there is no need to utilize a buffer, and measures against overflow and underflow become unnecessary. Also, since the data, for example control data, which is recorded/reproduced at a fixed bit rate, is arranged in a location different from that of the main data which is recorded/reproduced at a non-fixed (unequal or variable) bit rate, instantaneous access to each frame unit is easily possible. In addition, since the error correction codes are recorded/reproduced in unequal lengths similarly to the main data, error correction codes can be added very efficiently.

BRIEF DESCRIPTION OF THE DRAWINGS

FIG. 3 is a drawing showing an embodiment of bit stream data per frame for an embodiment of a signal encoding/decoding device of the prior art;

FIG. 4 is a drawing showing an embodiment of bit stream data per frame for an embodiment of a signal encoding/decoding device using an unequal length encoding system of the prior art;

FIG. 5 is a drawing showing an embodiment of bit stream data per frame for an example of a signal recording or reproduction device according to the present invention;

DESCRIPTION OF THE PREFERRED EMBODIMENT OF THE INVENTION

The basic principle of the present invention can be easily described as utilizing the fact that a signal recording and/or reproduction device capable of recording and reproducing in real time using a semiconductor memory as a recording medium does not require writing/reading to be done at a fixed speed due a lack of movable parts, and therefore when employing unequal length encoding as the encoding system, acts as follows: when writing onto the medium, writing speed and writing time are controlled according to the encoded bit count per frame, and when reading from the medium, reading speed and reading time are controlled according to the bit count per frame of data read. At this time, an error correction method is selected according to the bit count per frame. For example, in the case of a lower bit count, a shorter error correction code is selected, and in the case of a higher bit count, a longer error correction code is selected. Also, the control data such as frame ID, start address, bit count, and so forth, is recorded at a fixed speed in a specific section separate from that of the main data, and, when reading is done, this control data is read at a fixed speed from that specific section, with the above mentioned reading speed and time being controlled based on the data.

An explanation will now be made of a preferred embodiment of the present invention, with reference to the accompanying drawings.

Figure 1:
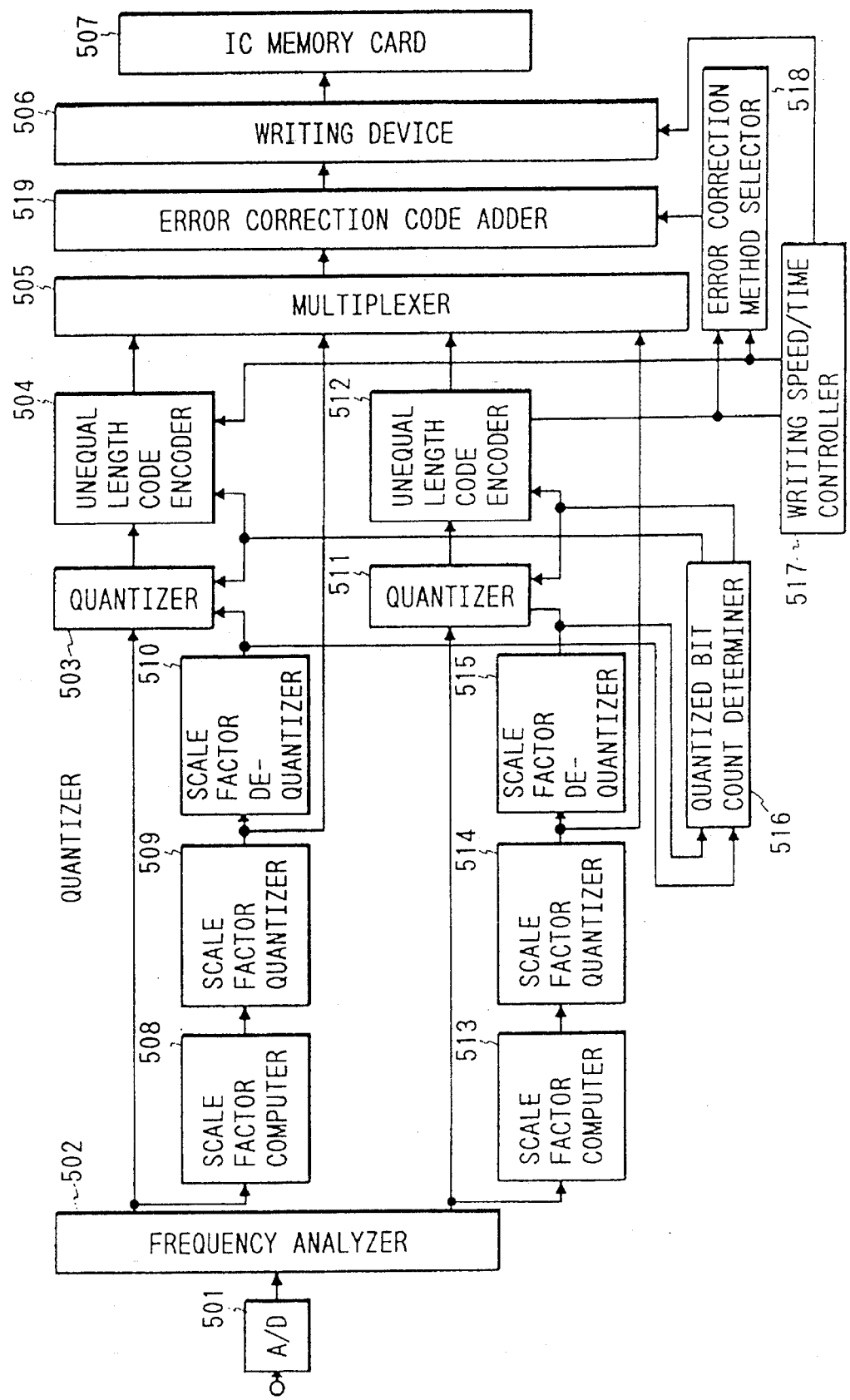
FIG. 1 is a block circuit diagram showing an example of a signal recording device according to the present invention.

FIG. 1 is a block circuit diagram showing an example of a signal recording device according to the present invention.

In the signal recording device shown in FIG. 1, an inputted analog tone signal is A/D (analog/digital) converted with an A/D converter 501 and becomes a digital signal, and is grouped into prescribed sample numbers of data for frame processing and outputted. This data is frequency analyzed with a frequency analyzer 502 and divided into signals of, for example, two frequency bands. The frequency analyzed signal of each band is fed to scale factor computers 508 and 513, where their scale factors are calculated for quantization, and each is fed to their respective scale factor quantizers 509 and 514. At the scale factor quantizers 509 and 514, each of the above mentioned scale factors are quantized with the prescribed bit counts, and are fed to scale factor dequantizers 510 and 515 and to a multiplexer 505. At the dequantizers 510 and 515, each of the quantized scale factors are dequantized. These dequantized values are each fed to quantizers 503 and 511 while also being fed to a quantized bit count determiner 516 where the bit count for quantizing each band signal is determined and sent to the quantizers 503 and 511. At the quantizers 503 and 511, the data of the two band signals from the above-mentioned frequency analyzer 502 is each quantized, depending on the above mentioned dequantized scale factor and the respective bit counts. The respective band data quantized by these quantizers 503 and 511 is inputted to unequal length encoders 504 and 512, and is encoded into unequal length codes. This data encoded into unequal length codes is then fed to a multiplexer 505.

Next, the encoded total bit count is outputted from the unequal length encoders 504 and 512 and sent to a writing speed/time controller 517 and an error correction method selector 518. At the writing speed/time controller 517, the total encoded bit count for the frame is calculated and outputted to the multiplexer 505. At the multiplexer 505, the above described inputted data is multiplexed and then sent to an error correction code adder 519. At the error correction method selector 518, the error correction method is selected according to the bit count per frame, and the signal is sent to the error correction code adder 519. This error correction code adder 519 adds an error correction code to the bit stream data from the multiplexer 505 according to the error correction method selected by the error correction method selector 518. The data is then sent to a writing device 506.

In an embodiment of selection of an error correction method according to the bit count per frame with the error correction method selector 518, due to the fact that a shorter error correction code is selected when the bit count is lower and a longer error correction code is selected when the bit count is higher, it is possible to minimize the reduction of the bit rate caused by addition of the correction code. Also, with the selection contrary to the above described, recording and reproduction of higher correctability is made possible. Regarding the writing speed of the band, which corresponds to the totality of the calculated bit counts, a writing speed/ time controller 517 controls the write clock in such a way that writing is done at a higher speed in the case of a higher bit count and at a lower speed in the case of a lower bit count, and outputs the data to the writing device 506. Or, if writing is always done at a high speed, the write signal time is controlled and outputted to the writing device 506. At the writing device 506, processing is performed wherein the bit stream data from the multiplexer 505 is synchronized with the write clock according to the above mentioned write clock signal, and written onto the IC memory card (IC card) 507 which is a semi-conductor memory. At the same time, the control data including main data frame ID, start address, bit count, and so forth, of this unequal length encoded tone signal is written at a fixed speed in a section separate from that of the above mentioned main data recorded in the recording area of the IC memory card 507.

Unlike the prior art, in a signal recording device such as the above one, since writing speed or writing time onto the IC memory card 507 is being controlled according to the bit count per frame, recording with unequal length codes is possible without utilizing a buffer. Therefore the prior art buffer processing and measures against overflow and underflow become unnecessary, there is no hardware scale increase due to a buffer, and problems such as the characteristic deterioration due to manipulation of scale factors to counter overflow or underflow do not arise. Also, since the error correction codes are recorded/reproduced as unequal length codes, in the same manner as that of the main data, error correction codes can be added very efficiently. Depending on the nature of the system, in cases where alteration to high correctability is desired even at a sacrifice to some extent of the bit rate, or in the reverse cases, such an adaptation is possible by altering the writing manner. In addition, since the control data is recorded at a fixed bit rate in a location separate from that of the main data recorded at an unequal bit rate, when reproducing the signal, instantaneous access to each frame unit is easily possible due to this control data being read first.

Figure 2:
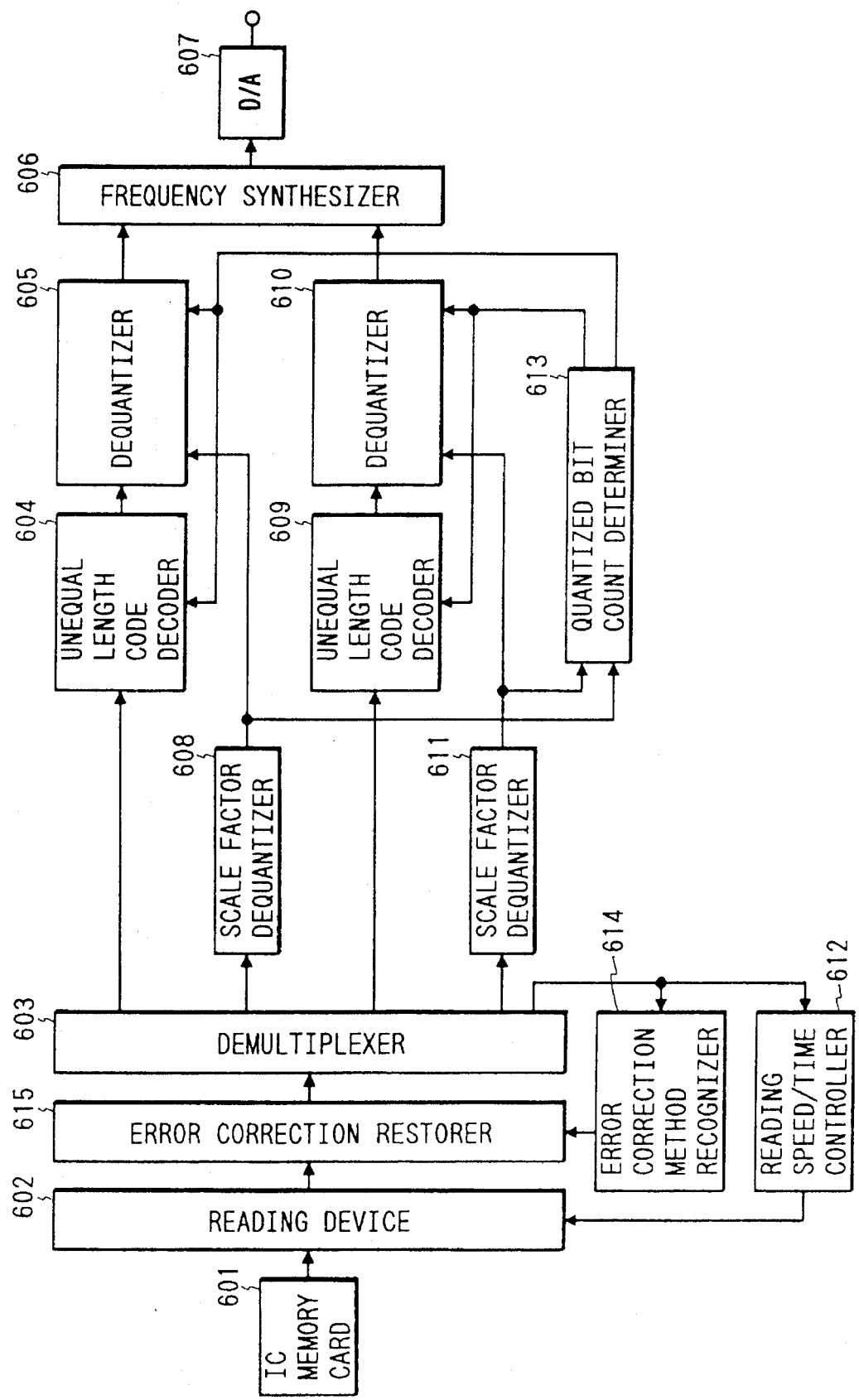
FIG. 2 is a block circuit diagram showing an example of a signal reproduction device according to the present invention.

Next, FIG. 2 shows an embodiment of a signal reproduction device according to the present invention.

In this reproduction device shown in FIG. 2, the above mentioned control data of the frame which is to be read is first read from, for example, an IC memory card 601 which is a semiconductor memory, through a reading device 602. The value of this control data, particularly the bit count per frame, is sent to a reading speed/time controller 612 and an error correction method recognizer 614. At the reading speed/time controller 612, the read clock is controlled according to the total encoded bit count, in such a way that the main data is read at a higher speed in the case of a higher bit count and at a lower speed in the case of a lower bit count, and the data is outputted to the reading device 602. Or, if reading is always done at a high speed, the read signal time is controlled and the data outputted to the reading device 602. At the error correction method recognizer 614, the error correction method selected at the time of writing is recognized, and the control output which applies is sent to an error correction restorer 615. At the reading device 602, the bit stream data from the IC memory card 601 corresponding to the read signal is sent to the error correction restorer 615. At the error correction restorer 615, error correction restoration processing is done on the bit stream data from the reading device 602, according to the error correction code corresponding to the above mentioned recognized error correction method, and the data is fed into the demultiplexer 603.

The above-mentioned error corrected bit stream data is divided into quantized main data and quantized scale factors for each band by a demultiplexer 603. The main data of each band is inputted to unequal length code decoders 604 and 609 and decoded, and then sent to dequantizers 605 and 610. The above-mentioned quantized scale factor of each band is each dequantized at scale factor dequantizers 608 and 611, and sent to the dequantizers 605 and 610 and a quantized bit count determiner 613. At the quantized bit count determiner 613, the quantized bit count is determined for each of the above-mentioned bands, and outputted to dequantizers 605 and 610. At the dequantizers 605 and 610, the quantized data of each of the above-mentioned bands is dequantized, depending on the dequantized scale factor or quantized bit count for each of the above-mentioned bands. The dequantized data of each band is then synthesized at a frequency synthesizer 606, D/A (digital/analog) converted at a D/A converter 607, and outputted.

In a signal reproduction device such as the above one, since reading speed or reading time onto the IC memory card 601 is being controlled according to the bit count per frame, reproduction is possible without utilizing a buffer of the prior art. Therefore, different from the prior art cases, even when employing unequal length codes, buffer processing and measures against overflow and underflow become unnecessary, there is no hardware scale increase, and problems such as the characteristic deterioration due to manipulation of scale factors to counter overflow or underflow do not arise. Also, since recording or reproduction of the error correction codes is done as unequal length codes, in the same manner as that of the main data, error correction codes can be added very efficiently. In addition, since the control data is read first at a fixed bit rate in a location separate from that of the main data, instantaneous access to each frame unit in a frame after frame manner is easily possible.

Figure 8:
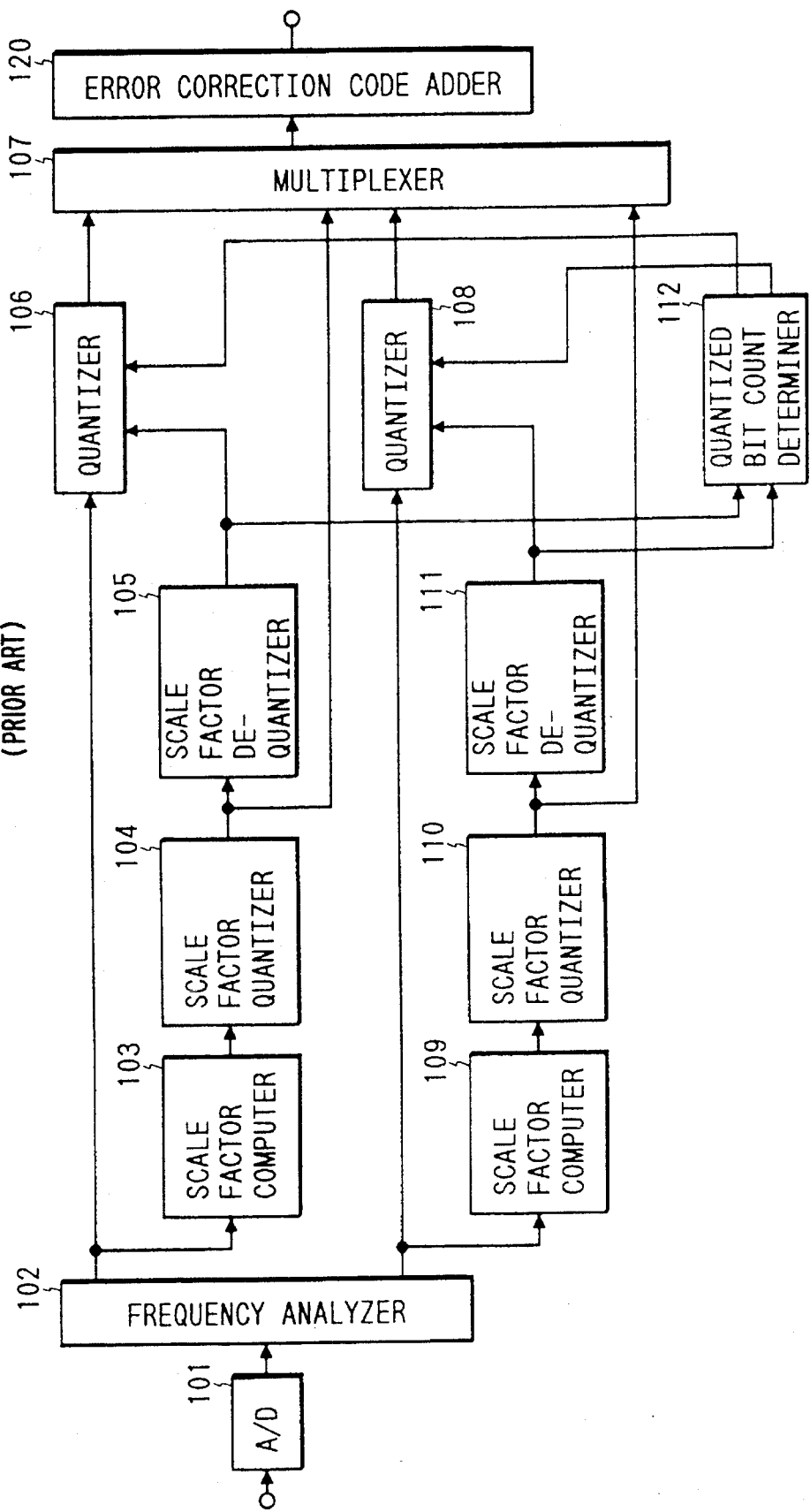
FIG. 8 is a block circuit diagram showing an embodiment of a signal encoding device of the prior art.
Figure 9:
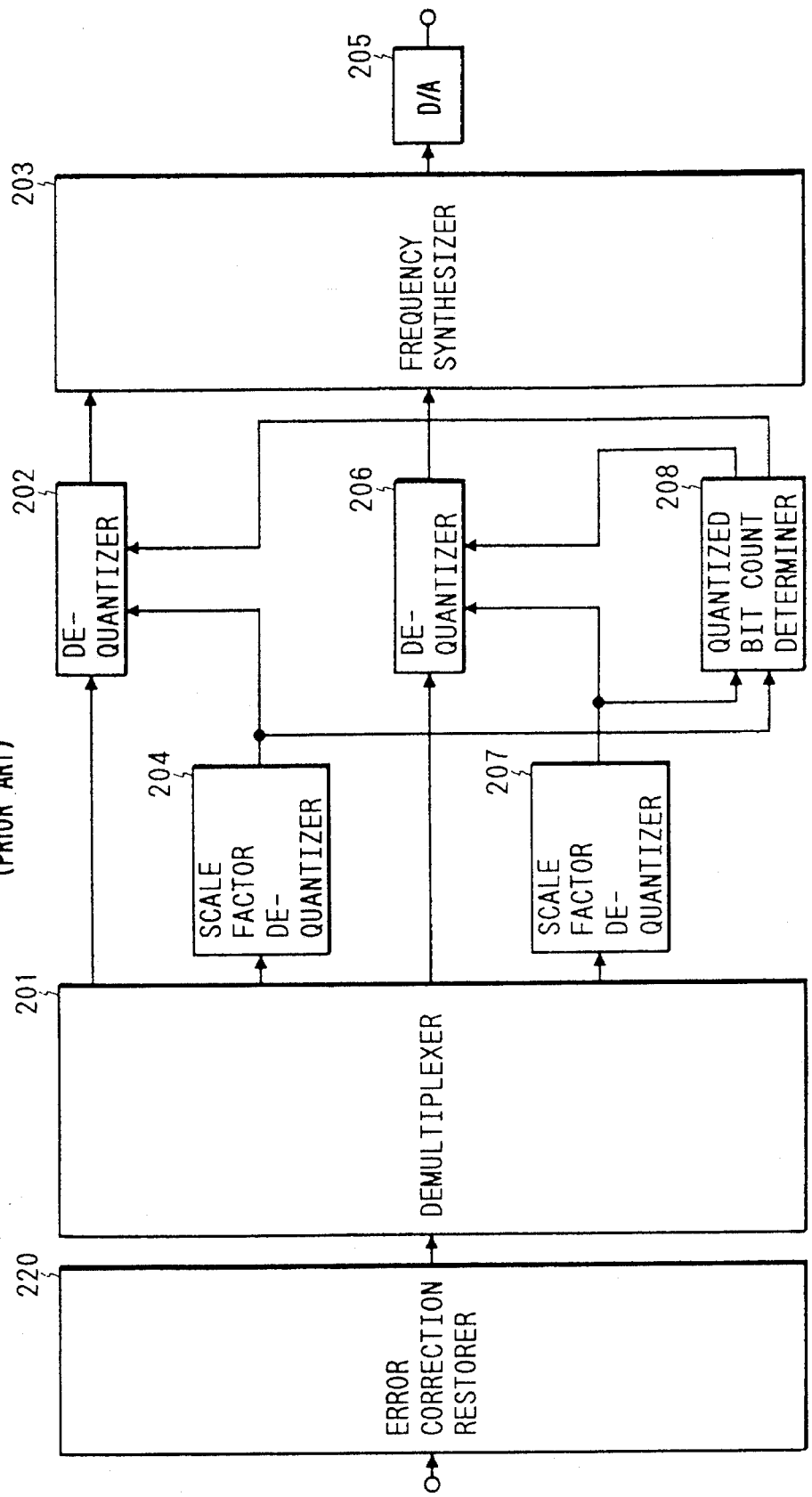
FIG. 9 is a block circuit diagram showing an embodiment of a signal decoding device of the prior art.
Figure 10:
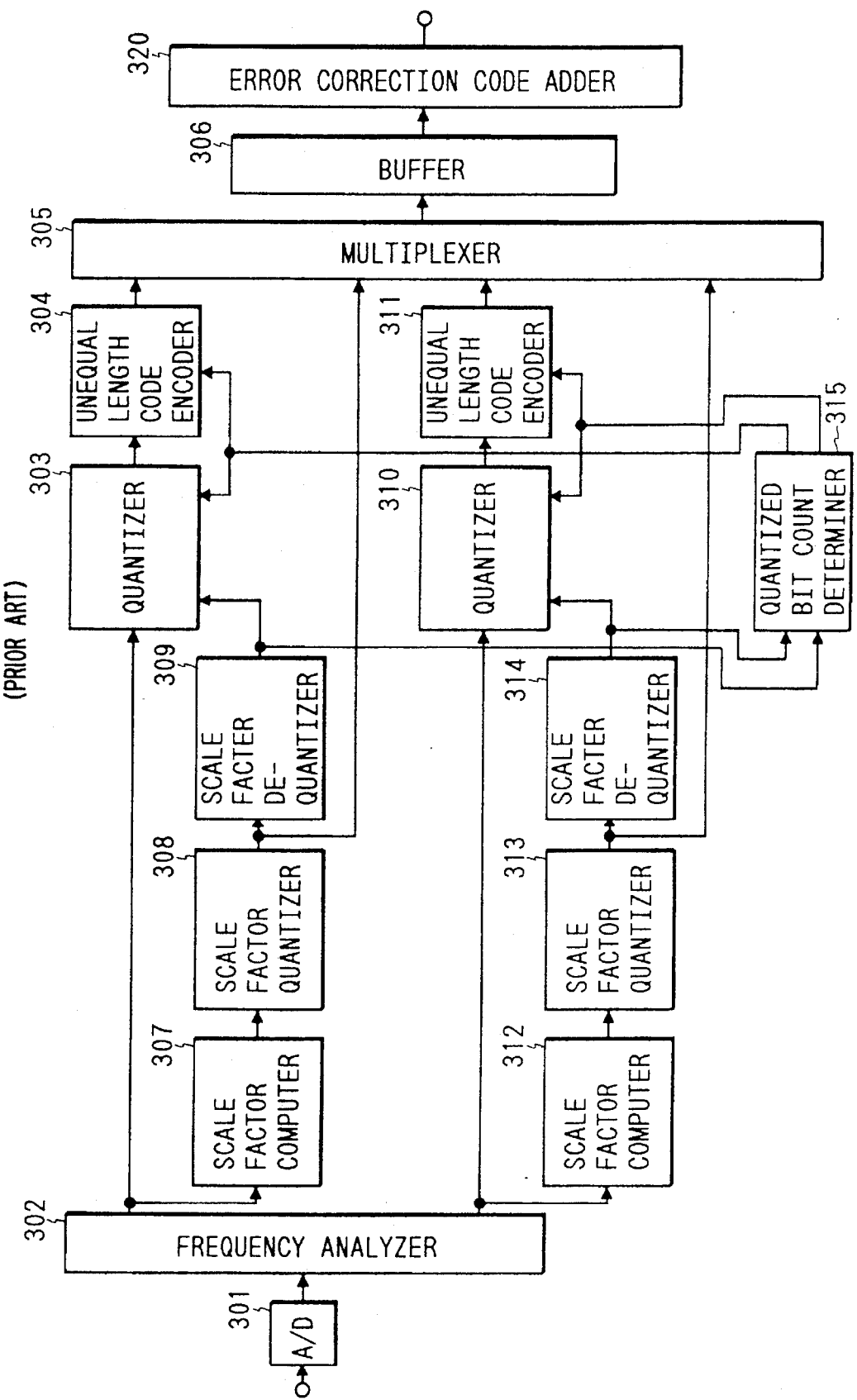
FIG. 10 is a block circuit diagram showing an embodiment of a signal encoding device using an unequal length encoding system of the prior art.
Figure 11:
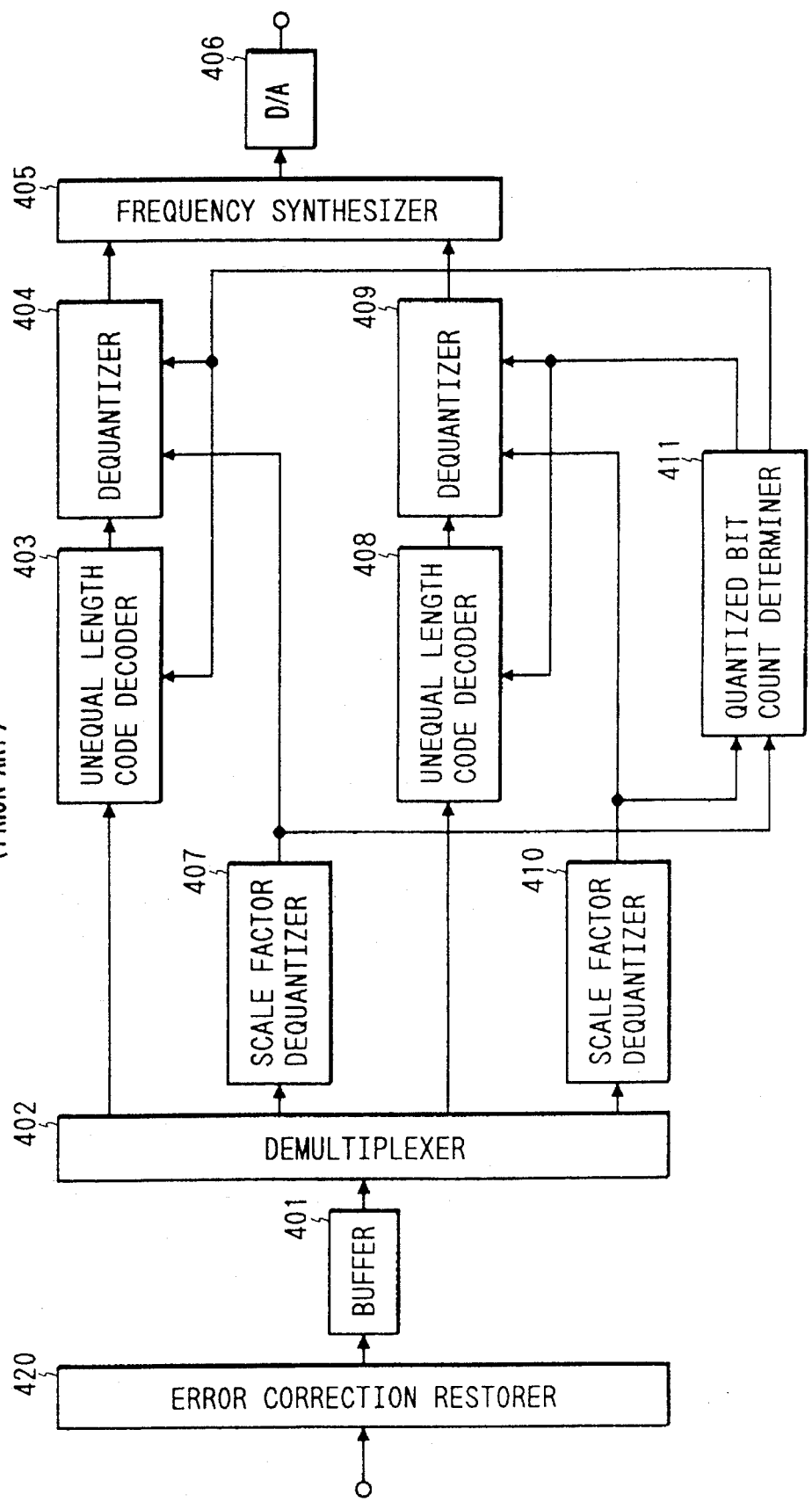
FIG. 11 is a block circuit diagram showing an embodiment of a signal decoding device using an unequal length encoding system of the prior art.

Next, FIGS. 3–5 show embodiments of bit streams per frame for each system. Specifically, FIG. 3 represents a case for the systems shown in FIG. 8 and FIG. 9 of the prior art, FIG. 4 represents a case for the systems using an unequal length encoding system shown in FIG. 10 and FIG. 11, and FIG. 5 represents a case for the system shown in FIG. 1 and FIG. 2 which are examples of the present invention. In FIGS. 3 to 5, the frame numbers, for example n−1, n, n+1 are shown horizontally for each frame, while the bit count per one frame is shown vertically.

Figure 6:
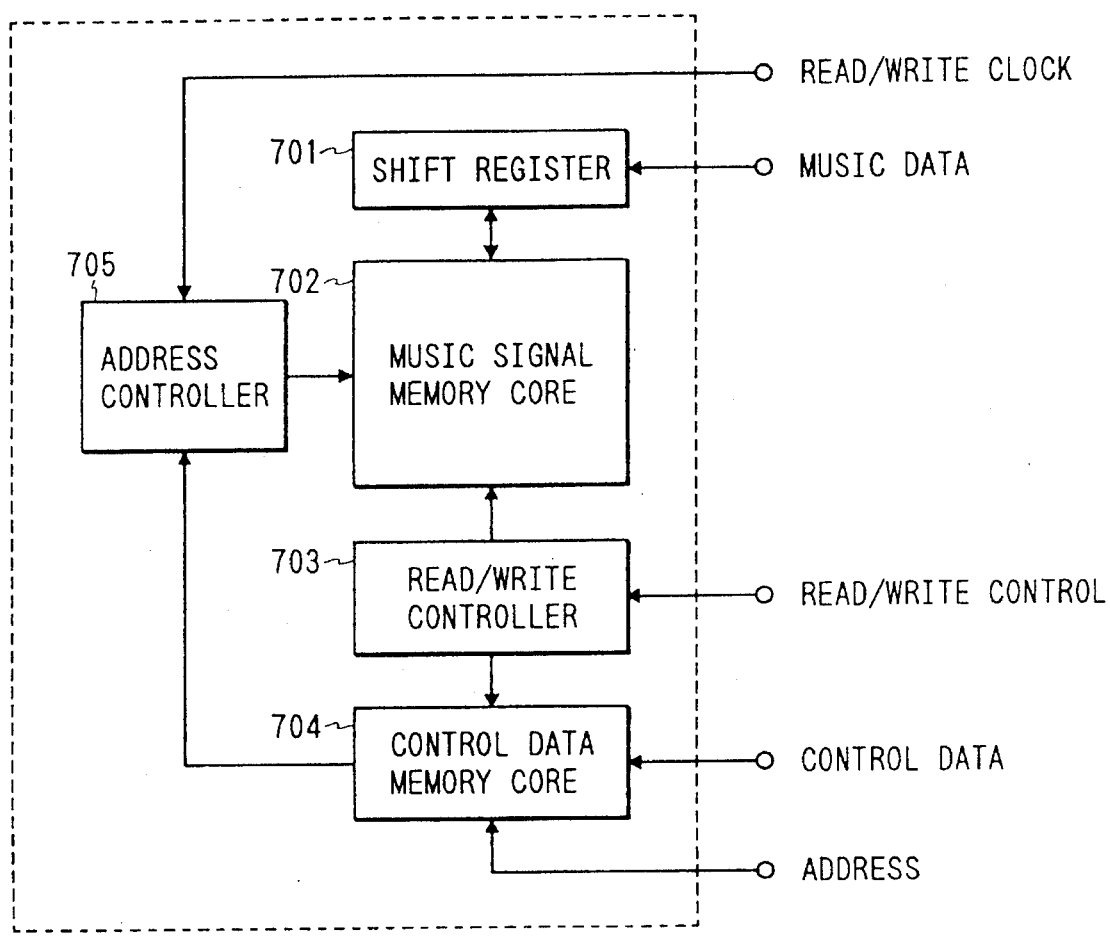
FIG. 6 is a block circuit diagram showing an embodiment of a concrete configuration of a semi-conductor memory for an example according to the present invention.
Figure 7:
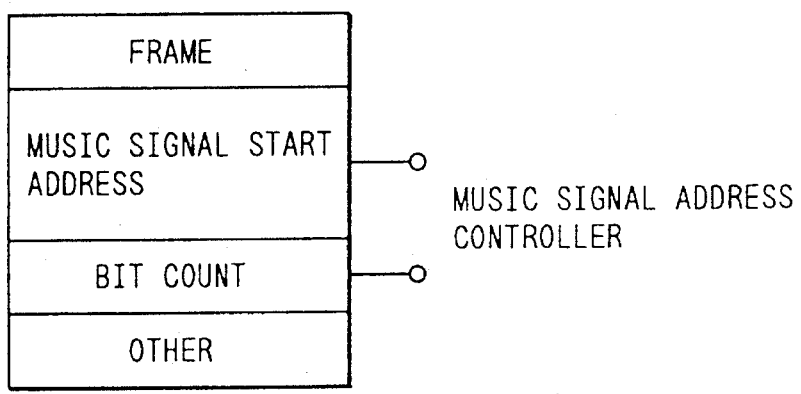
FIG. 7 is a drawing showing an embodiment of control data for an example according to the present invention.

Next, FIG. 6 shows an embodiment of the semiconductor memory of the above mentioned IC memory card, while FIG. 7 shows an embodiment of the control data.

In these drawings, when data (main data) of a music signal is written to a music signal memory core 702, it is done by sending a write command to a read/write controller 703, while inputting the address and data to a control data memory core 704. The opening address and bit count are outputted from the control data memory core 704 to a music signal (main data) address controller 705. The address controller 705 increments the address in synchronization with the clock until the inputted address increases by the bit count. At this time, when the music data (main data) is synchronized with the clock and inputted to a shift register 701, data may be written to the music signal memory core 702.

When data is read from the music signal memory core 702, control data is outputted according to a read command sent to the read/write controller 703, while inputting the address to the control data memory core 704. The opening address and bit count are outputted from the control data memory core 704 to the music signal address controller 705. The address controller 705 increments the address in synchronization with the read clock until the inputted address increases by the bit count. The shift register 701 converts the signal outputted from the music signal memory core 702 to serial which is then outputted in synchronization with the clock.

Further, the present invention is not always limited to the above-mentioned example only. For example, as a semiconductor memory working as a recording medium, not only an IC memory card, but a memory cartridge or memory pack, and so forth, are possible candidates as well. Also, the present invention can of course be applied to a signal recording device, signal reproduction device or a signal recording or reproduction device. In addition, the circuit configuration is not limited to the embodiments shown in the drawings, for example, the number of divided bands may be 3 or more, and the configuration of the semi-conductor memory is not limited to the embodiment shown in FIG. 6.

According to a signal recording and/or signal reproduction device according to the present invention, when quantized data is encoded in an unequal manner and recorded/reproduced, the speed or time of writing and/or reading is controlled according to the encoded bit count per frame. Since the recording or reproduction is done with separate sections of the above mentioned recording medium for unequal (unequal or variable) and fixed recording or reproduction speed or time, a buffer as well as measures against overflow and underflow become unnecessary, and instantaneous access to each frame unit is easily possible.

Also, according to a signal recording and/or reproduction device according to the present invention, when quantized data is encoded in an unequal manner and recorded, the speed or time of writing and/or reading is controlled according to the encoded bit count per frame, and since the error codes are also recorded/reproduced as unequal lengths using the above mentioned recording medium and according to the bit count per frame of the above mentioned data, error correction codes can be added very efficiently.

What is claimed is:

1. A signal recording device, comprising:

means for providing quantized signals depending upon a predetermined scale factor and predetermined bit counts;

an unequal length encoder for encoding said quantized signals into unequal length coded quantized signals, said unequal length coded quantized signals being representative of the respective bit counts of said quantized signals;

a multiplexer receiving said unequal length coded quantized signals and outputting bit stream data based thereon;

a writing speed/time controller receiving said unequal length coded signals from said unequal length encoder, wherein said writing speed/time controller includes means for calculating a total encoded bit count for each frame of said unequal length coded signals and means for providing a write speed signal based on said total encoded bit count;

an error correction method selector selecting an error correction method according to the bit count per frame calculated by said writing speed/time controller;

an error correction code adder receiving said bit stream data from said multiplexer and an error correction method signal from said error correction method selector and adding an error correction code to said bit stream data from the multiplexer according to the error correction method selected by the error correction method selector; and a writing device responsive to said error correction code adder for writing said bit stream data with said error correction code to a recording medium at a rate determined by said write speed signal provided from said writing speed/time controller.

2. The device as set forth in claim 1, wherein said error correction code is shorter when the bit count per frame calculated by said writing speed/time controller is lower and is longer when the bit count per frame calculated by said writing speed/time controller is higher, thereby minimizing the reduction of the bit rate caused by addition of the error correction code.

3. The device as set forth in claim 1, wherein said means for providing quantized signals comprises:

means for providing an analog tone signal;

an A/D converter converting said analog tone signal to a digital signal which is grouped into prescribed sample numbers of data for frame processing and outputted by said A/D converter;

a frequency analyzer analyzing said outputted digital signal from said A/D converter to produce frequency-analyzed signals for at least a first frequency band and a second frequency band;

first and second scale factor computers for calculating respective first and second scale factors based on said frequency-analyzed signals;

first and second scale factor quantizers respectively coupled to said first and second scale factor computers for quantizing said first and second scale factors with prescribed bit counts; and first and second scale factor dequantizers receiving said first and second scale factors with prescribed bit counts respectively from said first and second scale factor quantizers to provide dequantized values based thereon; and a quantized bit count determiner receiving said dequantized values and calculating said predetermined bit counts based on said dequantized values.

4. A device capable of recording and reproducing a signal on a recording medium, comprising:

means for recording frames of quantized data onto said recording medium, said frames differing in bit-length, wherein a first number of bits in each of said frames of quantized data is recorded on a first portion of said recording medium and a second number of bits in each of said frames of quantized data is recorded on a second portion of said recording medium, said first number of bits being representative of total bit-length of its frame;

means for reading frames of quantized data from said recording medium, including reading said first number of bits; and means for controlling a speed at which said means for reading reads frames of quantized data from said recording medium, said speed being controlled based on the total bit-length of each frame of said first number of bits read out from the first portion of said recording medium.

5. A device according to claim 4, further comprising means for providing an error correction code to each frame of quantized data to be recorded onto said recording medium.

6. A device according to claim 5, wherein said first number of bits include bits which correspond to said error correction codes.

7. A device according to claim 6, wherein the total number of said bits per frame which correspond to said error correction code depends proportionately on the bit-length of the frame.

8. A device according to claim 4, wherein said recording medium is an integrated circuit memory device.

9. A method of recording and reproducing a signal on a recording medium, comprising:

recording frames of quantized data onto said recording medium, said frames differing in bit-length, wherein a first number of bits in each of said frames of quantized data is recorded on a first portion of said recording medium and a second number of bits in each of said frames of quantized data is recorded on a second portion of said recording medium, said first number of bits being representative of total bit-length of its frame;

reading frames of quantized data from said recording medium, including reading said first number of bits; and controlling a speed at which said step of reading frames of quantized data from said recording medium is performed, said speed being controlled based on the total bit-length of each frame of said first number read out from the first portion of said recording medium.

10. A method according to claim 9, further comprising the step of providing an error correction code to each frame of quantized data to be recorded onto said recording medium.

11. A method according to claim 10, wherein said first number of bits include bits which correspond to said error correction codes.

12. A method according to claim 11, wherein the total number of said bits per frame which correspond to said error correction code depends proportionately on the bit-length of the frame.

13. A device according to claim 9, wherein said recording medium is an integrated circuit memory device.

* * * * *